United States Patent
Kishinami et al.

(10) Patent No.: US 9,472,095 B2
(45) Date of Patent: Oct. 18, 2016

(54) ELECTRONIC APPARATUS AND CONTROL METHOD FOR ELECTRONIC APPARATUS

(75) Inventors: Yuichiro Kishinami, Kawasaki (JP); Yasuharu Onishi, Kawasaki (JP); Motoyoshi Komoda, Kawasaki (JP); Nobuhiro Kawashima, Kawasaki (JP); Yukio Murata, Kawasaki (JP); Jun Kuroda, Kawasaki (JP); Shigeo Satou, Kawasaki (JP)

(73) Assignee: NEC CORPORATION, Tokyo (JP)

( * ) Notice: Subject to any disclaimer, the term of this patent is extended or adjusted under 35 U.S.C. 154(b) by 446 days.

(21) Appl. No.: 13/993,676

(22) PCT Filed: Nov. 24, 2011

(86) PCT No.: PCT/JP2011/006522
§ 371 (c)(1),
(2), (4) Date: Jun. 12, 2013

(87) PCT Pub. No.: WO2012/086126
PCT Pub. Date: Jun. 28, 2012

(65) Prior Publication Data
US 2013/0286792 A1 Oct. 31, 2013

(30) Foreign Application Priority Data
Dec. 20, 2010 (JP) .................. 2010-282657

(51) Int. Cl.
| | |
|---|---|
| H04M 1/00 | (2006.01) |
| G08C 23/00 | (2006.01) |
| H03K 17/96 | (2006.01) |
| H04M 1/02 | (2006.01) |
| G06F 1/16 | (2006.01) |

(52) U.S. Cl.
CPC ............. *G08C 23/00* (2013.01); *G06F 1/1677* (2013.01); *H03K 17/96* (2013.01); *H04M 1/0245* (2013.01); *H03K 2217/96011* (2013.01)

(58) Field of Classification Search
CPC ........... H04M 1/0245; H04M 1/0214; H04M 1/0237
See application file for complete search history.

(56) References Cited

U.S. PATENT DOCUMENTS 6,381,447 B1 * 4/2002 Eguchi ................ H04M 1/0245
379/421
6,937,718 B2 8/2005 Scholte
(Continued)

FOREIGN PATENT DOCUMENTS

| CN | 100593351 C | 3/2010 |
|---|---|---|
| JP | 11-177660 A | 7/1999 |

(Continued)

OTHER PUBLICATIONS

Chinese Office Action dated Oct. 8, 2014 with an English translation thereof.
(Continued)

*Primary Examiner* — Shantell L Heiber
(74) *Attorney, Agent, or Firm* — McGinn IP Law Group PLLC

(57) ABSTRACT

A second housing 200 is capable of moving in a direction in which the second housing covers one surface of a first housing 100. Oscillating elements of an oscillating element group 400 are arranged in a matrix and oscillate sound waves outward from the one surface of the first housing 100. A control unit controls the plurality of oscillating elements. A sound wave sensor constitutes the same matrix as the plurality of oscillating elements and detects sound waves having a specific wavelength. The detection results of the sound wave sensor are output to the control unit. A frame body holds the plurality of oscillating elements and the sound wave sensor. The control unit oscillates sensor sound waves having a specific wavelength outward from at least one of the oscillating elements. The control unit determines that the second housing 200 covers the one surface of the first housing 100 when the sound wave sensor detects the sound waves having the specific wavelength.

16 Claims, 4 Drawing Sheets

(56) References Cited

U.S. PATENT DOCUMENTS

| | | | |
|---|---|---|---|
| 2005/0141702 A1 | 6/2005 | Fan et al. | |
| 2005/0213432 A1 | 9/2005 | Hoshuyama | |
| 2010/0323772 A1* | 12/2010 | Kiryu | H04M 1/0245 455/575.4 |
| 2011/0211035 A1* | 9/2011 | Ota | H04S 7/303 348/14.01 |

FOREIGN PATENT DOCUMENTS

| | | |
|---|---|---|
| JP | 2002-368844 A | 12/2002 |
| JP | 2003-102097 A | 4/2003 |
| JP | 2005-045516 A | 2/2005 |
| JP | 2005-175980 A | 6/2005 |
| JP | 2005-333574 A | 12/2005 |
| JP | 2006-211036 A | 8/2006 |
| JP | 2007-214855 A | 8/2007 |
| WO | WO 2004/034734 A1 | 4/2004 |

OTHER PUBLICATIONS

European Search Report dated Jul. 4, 2014.
International Search Report dated Jan. 31, 2012 in PCT/JP2011/006522, with English translation thereof.
Japanese Office Action dated Jan. 19, 2016 with a partial English translation.

* cited by examiner

ELECTRONIC APPARATUS AND CONTROL METHOD FOR ELECTRONIC APPARATUS

TECHNICAL FIELD

The present invention relates to an electronic apparatus having a sound output function and a method of controlling the electronic apparatus.

BACKGROUND ART

There are two housings which are movably connected to each other in electronic apparatuses such as portable communication terminals. Such a type of electronic apparatus, when used, moves the two housings in a direction in which they are separated from each other. For example, Patent Document 1 discloses that in an imaging device having a speaker, sound output is controlled by detecting the opening and closing of a display panel.

RELATED DOCUMENT

Patent Document

[Patent Document 1] Japanese Unexamined Patent Publication No. 2005-175980

DISCLOSURE OF THE INVENTION

A technique to detect the opening and closing of the two housings, that is, to detect that one of the two housings covers the other one, generally uses a magnet and a magnetic sensor. However, an area occupied by the magnet and the magnetic sensor is large. In this case, the size of the electronic apparatus increases.

An object of the invention is to prevent the size of an electronic apparatus from increasing by providing an element to detect whether or not one housing covers the other housing.

According to the invention, there is provided an electronic apparatus including a first housing; a second housing that is movable in a direction in which the second housing covers one surface of the first housing; a plurality of oscillating elements that oscillate sound waves outward from the one surface of the first housing; a control unit that controls the plurality of oscillating elements; a sound wave sensor that detects sound waves having a specific wavelength; and a frame body that holds the plurality of oscillating elements and the sound wave sensor, wherein the control unit oscillates the sensor sound waves having the specific wavelength outward from at least one of the oscillating elements, and wherein when the sound wave sensor detects the sound waves having the specific wavelength, the control unit determines that the second housing covers the one surface of the first housing.

According to the invention, there is provided a method of controlling an electronic apparatus that includes a first housing and a second housing that is movable in a direction in which the second housing covers one surface of the first housing, the method including: providing in the electronic apparatus, a plurality of oscillating elements that oscillate sound waves outward from the one surface of the first housing, a control unit that controls the plurality of oscillating elements, and a sound wave sensor that detects sound waves having a specific wavelength; holding the plurality of oscillating elements and the sound wave sensor by the same frame body; and causing the control unit to oscillate the sensor sound waves having the specific wavelength outward from at least one of the oscillating elements, and when the sound wave sensor detects the sound waves having the specific wavelength, to determine that the second housing covers the one surface of the first housing.

According to the invention, it is possible to prevent the size of an electronic apparatus from increasing by providing an element to detect whether or not a second housing covers a first housing.

BRIEF DESCRIPTION OF THE DRAWINGS

The above-described objects, other objects, features and advantages will be further apparent from the preferred embodiments described below, and the accompanying drawings as follows.

DESCRIPTION OF EMBODIMENTS

Figure 1:
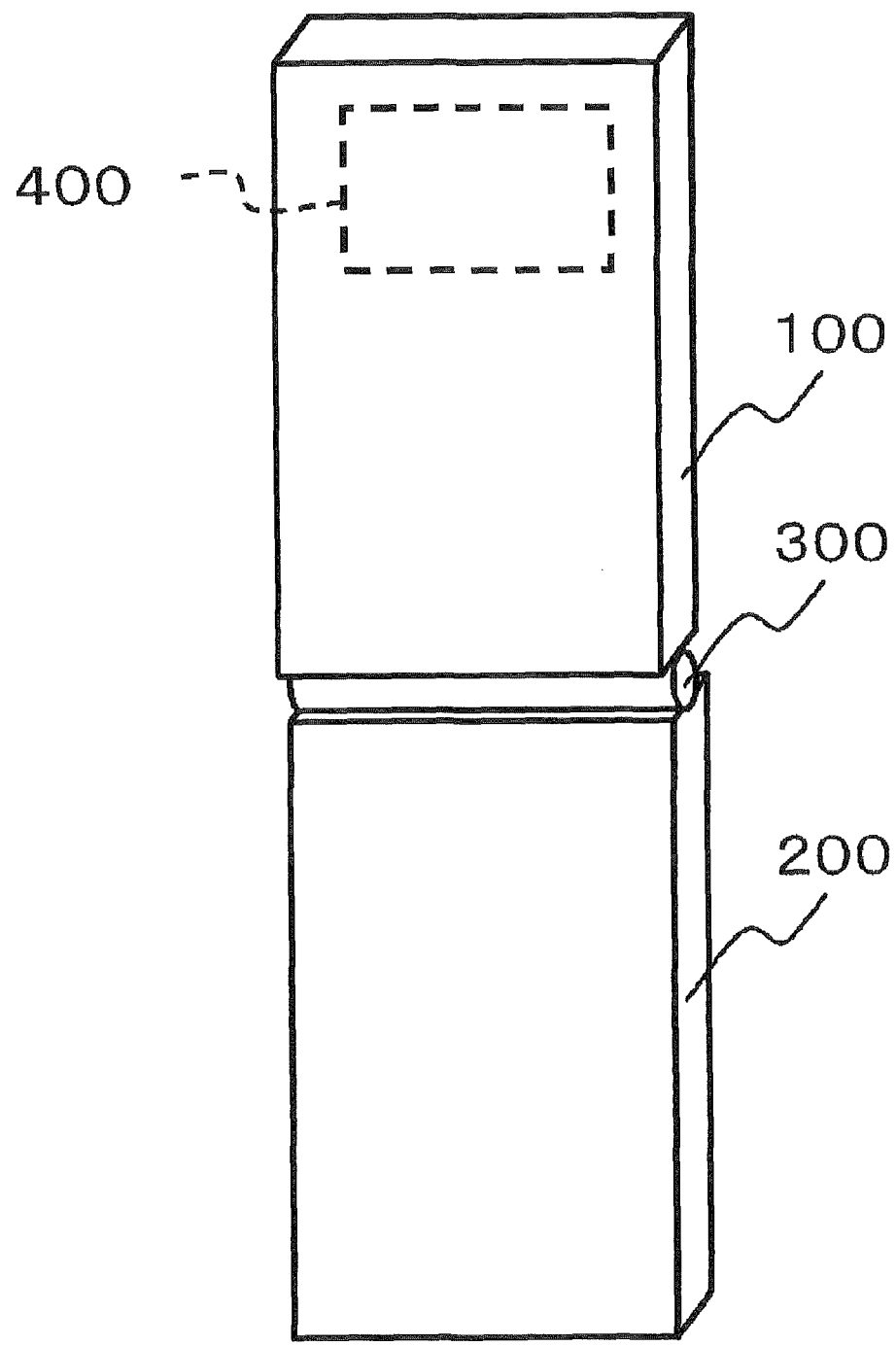
FIG. 1 is a schematic perspective view of an electronic apparatus according to a first embodiment.

Hereinafter, embodiments of the invention will be described with reference to the accompanying drawings. In addition, in all the drawings, like reference numerals denote like components, and a description thereof will not be repeated.

First Embodiment

Figure 2:
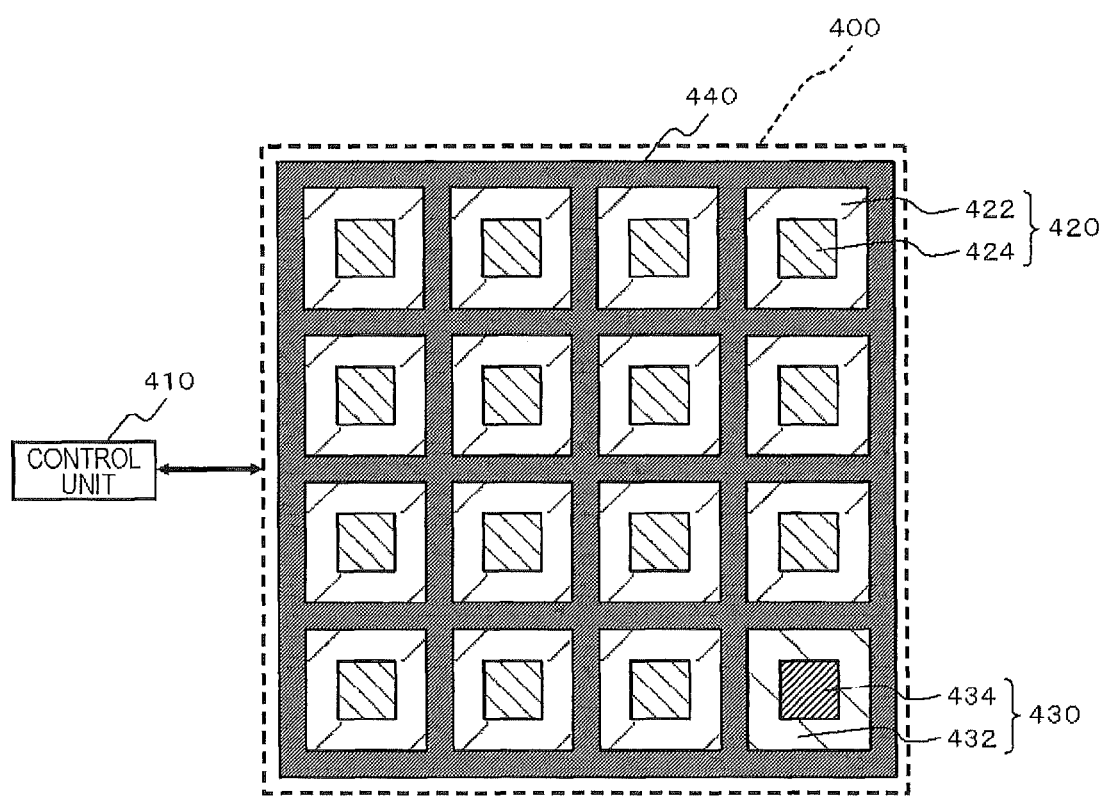
FIG. 2 is a plan view of an oscillating element group.

FIG. 1 is a schematic perspective view of an electronic apparatus according to a first embodiment. FIG. 2 is a plan view of an oscillating element group 400. The electronic apparatus includes a first housing 100 (see FIG. 1), a second housing 200 (see FIG. 1), a control unit 410 (see FIG. 2), oscillating elements 420 (see FIG. 2), a sound wave sensor 430 (see FIG. 2), and a frame body 440 (see FIG. 2). The plurality of oscillating elements 420 constitutes the oscillating element group 400 (see FIGS. 1 and 2). The second housing 200 can move in a direction in which the second housing 200 covers one surface of the first housing 100. The oscillating elements 420 of the oscillating element group 400 are disposed in a matrix, and oscillate sound waves outward from the above-described one surface of the first housing 100. The control unit 410 controls the plurality of oscillating elements 420. The sound wave sensor 430 constitutes one matrix with the plurality of oscillating elements 420, and detects sound waves having a specific wavelength. The detection results of the sound wave sensor 430 are output to the control unit 410. The frame body 440 holds the plurality of oscillating elements 420 and the sound wave sensor 430.

The control unit 410 oscillates sensor sound waves having a specific wavelength outward from at least one oscillating element 420. When the sound wave sensor 430 detects the sound waves having the above-described specific wavelength, the control unit 410 determines that the second housing 200 covers the one surface of the first housing 100, which will be described below in detail.

In the embodiment, the electronic apparatus is an openable portable communication terminal. For example, a display panel (not shown) is provided in the first housing 100, and an operation key (not shown) is provided in the second housing 200. The second housing 200 is rotatably attached to an end of the first housing 100 with a connection unit 300 interposed therebetween. Meanwhile, the connection unit 300 is, for example, a hinge.

The oscillating element 420 includes a vibration member 422 and a piezoelectric element 424. The vibration member 422 holds the piezoelectric element 424 on one surface thereof. The vibration member 422 vibrates by vibration generated from the piezoelectric element 424. In addition, the vibration member 422 adjusts a fundamental resonance frequency of the oscillating element 420. A fundamental resonance frequency of a mechanical vibrator depends on load weight and compliance. Since the compliance is machine stiffness of a vibrator, a fundamental resonance frequency of the piezoelectric element 424 can be controlled by controlling the stiffness of the vibration member 422. Meanwhile, the thickness of the vibration member 422 is preferably equal to or more than 5 μm and equal to or less than 500 μm. In addition, it is preferable that the vibration member 422 have a longitudinal elastic modulus, which is an index indicating stiffness, of equal to or more than 1 Gpa and equal to or less than 500 GPa. When the stiffness of the vibration member 422 is excessively low or high, there is a possibility that the characteristics and reliability as a mechanical vibrator are damaged. Meanwhile, the material for forming the vibration member 422 is not particularly limited as long as it is a material, such as a metal or a resin, having a high elastic modulus with respect to the piezoelectric element 424 which is formed of a brittle material, but is preferably phosphor bronze, stainless steel or the like from the viewpoint of workability or costs.

The frame body 440 is a grid-like frame body, and holds a peripheral edge portion of the vibration member 422 on the internal surface of each of the openings. In addition, the sound wave sensor 430 is fitted into one of the openings included in the frame body 440. It is preferable that the sound wave sensor 430 be fitted into the opening which is positioned at the outermost periphery among the openings of the frame body 440. The sound wave sensor 430 includes a vibration member 432 and a piezoelectric element 434. The vibration member 432 holds the piezoelectric element 434 on one surface thereof. In the sound wave sensor 430, the vibration member 432 vibrates by sound waves, and thus the piezoelectric element 434 is deformed, thereby generating electromotive force. The electromotive force is sent as a signal to the control unit 410. Meanwhile, it is preferable that a resonance frequency of the sound wave sensor 430 coincide with a resonance frequency of the oscillating element 420. In the embodiment, the oscillating element 420 and the sound wave sensor 430 have the same structure.

Meanwhile, the control unit 410 inputs audio data to the plurality of oscillating elements 420 constituting the oscillating element group 400. In other words, the oscillating element group 400 functions as a speaker. In the embodiment, the oscillating element group 400 functions as a parametric speaker. Specifically, the control unit 410 modulates audio data to be output into modulation data for a parametric speaker and then transmits the modulation data to the plurality of oscillating elements 420 constituting the oscillating element group 400. Meanwhile, a frequency of sound waves to be detected by the sound wave sensor 430 is the same as a carrier frequency of the modulation data for a parametric speaker. However, the control unit 410 may cause the oscillating element group 400 to function as a general speaker.

Figure 3:
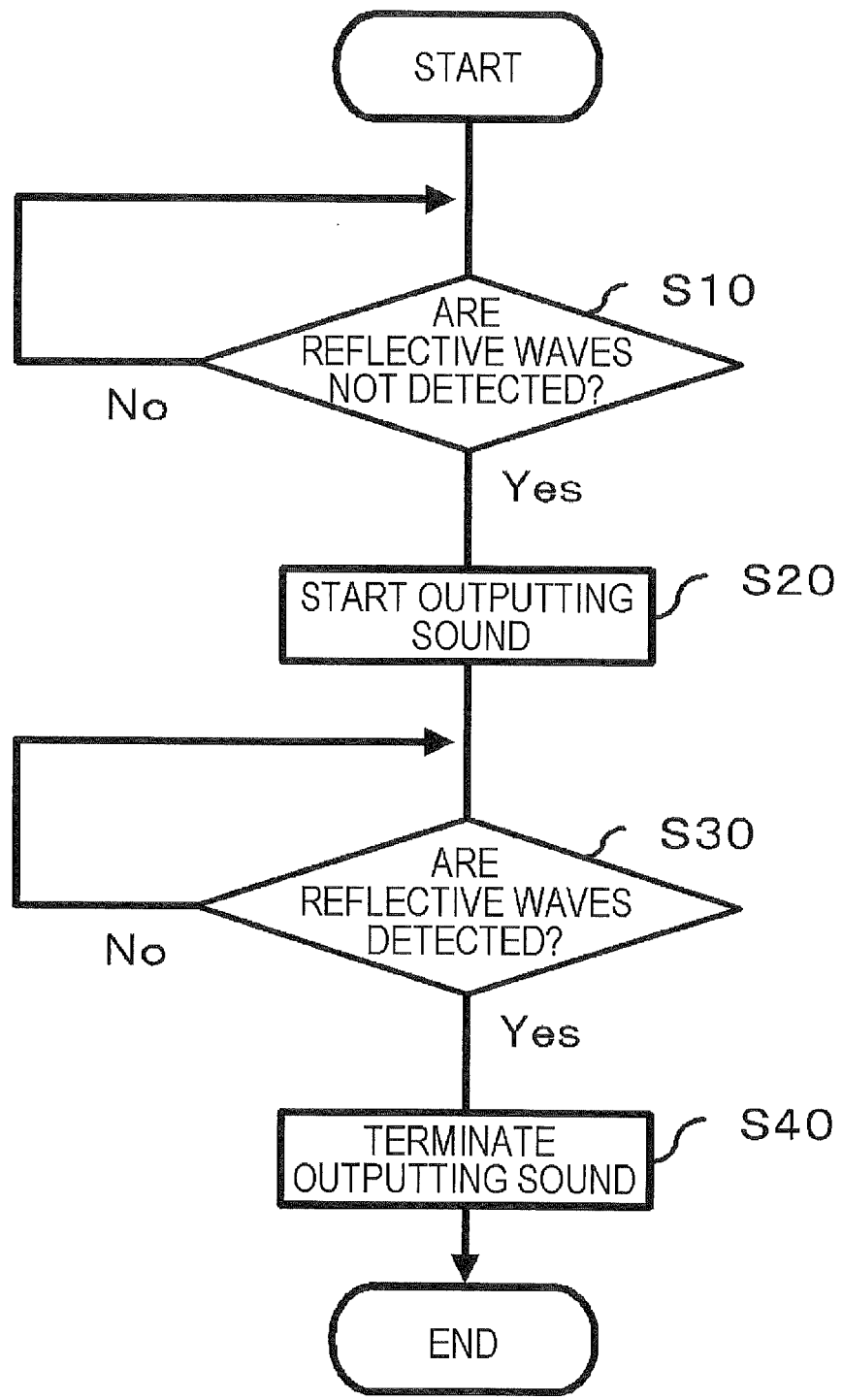
FIG. 3 is a flow chart illustrating an example of operations of the electronic apparatus illustrated in FIGS. 1 and 2.

FIG. 3 is a flow chart illustrating an example of operations of the electronic apparatus illustrated in FIGS. 1 and 2. The oscillating element 420 positioned next to the sound wave sensor 430 continuously oscillates ultrasonic waves having the resonance frequency of the sound wave sensor 430. While the second housing 200 covers the one surface of the first housing 100, the ultrasonic waves oscillated by the oscillating element 420 are reflected by the second housing 200 and are incident on the sound wave sensor 430. Thus, while the sound wave sensor 430 detects reflective waves of the ultrasonic waves oscillated by the oscillating element 420 (step S10: No), the control unit 410 determines that the second housing 200 covers the one surface of the first housing 100, and thus a sound is not output.

On the other hand, when the sound wave sensor 430 does not detect the reflective waves of the ultrasonic waves oscillated by the oscillating element 420 (step S10: Yes), the control unit 410 determines that the second housing 200 does not cover the one surface of the first housing 100 and that the electronic apparatus is being used in an open state, and a sound is started to be output by the oscillating element 420 (step S20). Here, the sound to be output includes a call.

While the oscillating element 420 outputs the sound, the control unit 410 continuously determines whether or not the sound wave sensor 430 detects the reflective waves of carrier waves (for example, the ultrasonic waves having the resonance frequency of the sound wave sensor 430) of modulation waves that are output by the oscillating element 420 (step S30). When the sound wave sensor 430 starts to detect the reflective waves (step S30: Yes), the control unit 410 determines that the electronic apparatus is closed and that the second housing 200 covers the one surface of the first housing 100, and the output of the sound is terminated (step S40). Meanwhile, in step S40, the control unit 410 may reduce the output of the sound from the oscillating element 420.

The control unit 410 terminates the output of the sound even when a user of the electronic apparatus covers the oscillating element 420 using his or her hand, or the like (step S40).

As described above, according to the embodiment, the sound wave sensor 430 detects the reflective waves of the ultrasonic waves that are output from the oscillating element 420, and thus it is possible to detect whether or not the second housing 200 covers the first housing 100. In addition, since the oscillating elements 420 and the sound wave sensor 430 are held by the same frame body, it is possible to prevent the size of the electronic apparatus from increasing by providing the sound wave sensor 430.

In addition, when the oscillating element 420 and the sound wave sensor 430 have the same structure, the oscillating element 420 and the sound wave sensor 430 can be formed through the same process. Therefore, manufacturing costs of the electronic apparatus can be reduced.

Second Embodiment

Figure 4:
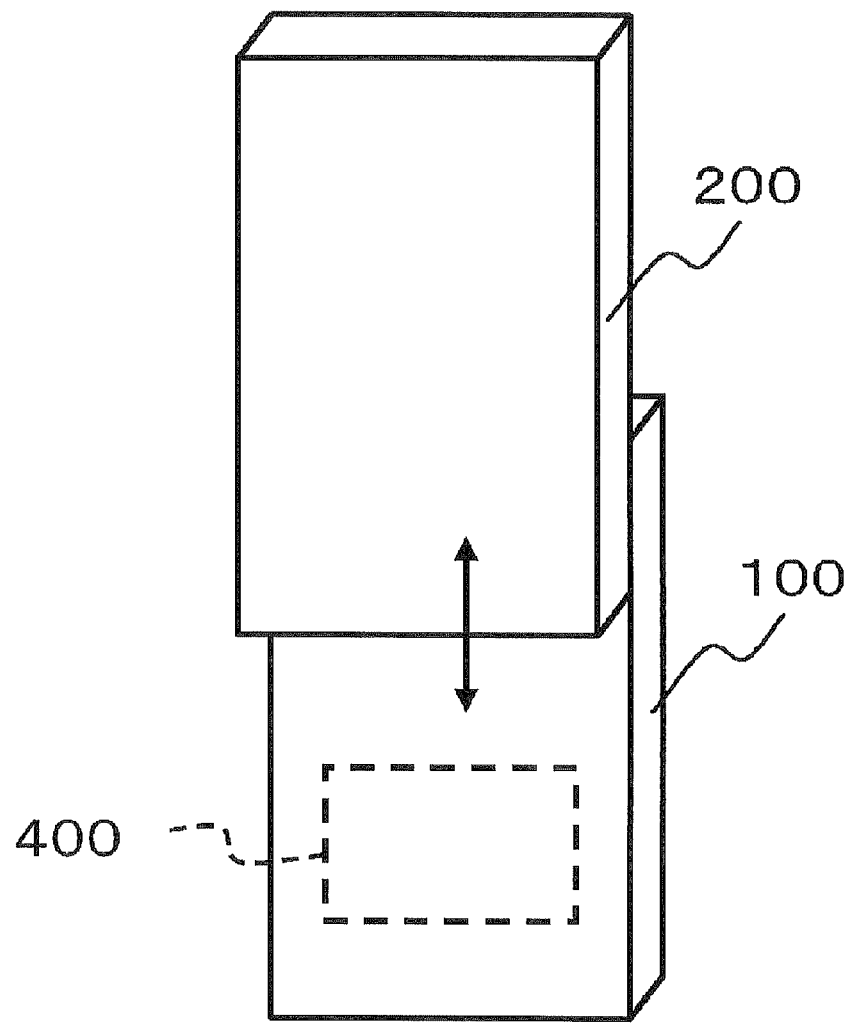
FIG. 4 is a schematic perspective view of an electronic apparatus according to a second embodiment.

FIG. 4 is a schematic perspective view of an electronic apparatus according to a second embodiment. The electronic apparatus according to the embodiment has the same configuration as the electronic apparatus according to the first embodiment except that the second housing 200 is slidably attached to the first housing 100.

The same effects as the first embodiment can also be obtained through the embodiment.

As described above, although the embodiments of the invention have been set forthwith reference to the drawings, they are merely illustrative examples of the invention, and various configurations other than the above stated can be adopted.

The application claims the priority based on Japanese Patent Application No. 2010-282657 filed on Dec. 20, 2010, the content of which is incorporated herein by reference.

The invention claimed is:

1. An electronic apparatus, comprising: a first housing;
a second housing that is movable in a direction in which the second housing covers one surface of the first housing;
a plurality of oscillating elements that oscillate sound waves outward from the one surface of the first housing;
a control unit that controls the plurality of oscillating elements;
a sound wave sensor that detects sound waves having a specific wavelength; and
a frame body that holds the plurality of oscillating elements and the sound wave sensor,
wherein the control unit oscillates the sensor sound waves having the specific wavelength outward from at least one of the oscillating elements,
wherein, when the sound wave sensor detects the sound waves having the specific wavelength, the control unit determines that the electronic apparatus is closed and the second housing covers the one surface of the first housing, and
wherein the first housing includes the plurality of oscillating elements and the sound wave sensor of the frame body.

2. The electronic apparatus according to claim 1, wherein the plurality of oscillating elements and the sound wave sensor are disposed so as to constitute a same matrix.

3. The electronic apparatus according to claim 1, wherein, when the control unit determines that the second housing covers the one surface of the first housing, the control unit terminates an oscillation of the plurality of oscillating elements or reduces an output of the plurality of oscillating elements.

4. The electronic apparatus according to claim 1, wherein the control unit inputs audio data to the plurality of oscillating elements and causes the plurality of oscillating elements to function as speakers.

5. The electronic apparatus according to claim 4, wherein the control unit uses modulation data for a parametric speaker as the audio data.

6. The electronic apparatus according to claim 5, wherein the sound waves having the specific wavelength include ultrasonic waves having a same frequency as a carrier frequency that is output by the plurality of oscillating elements.

7. The electronic apparatus according to claim 1, wherein the second housing is rotatably attached to the first housing.

8. The electronic apparatus according to claim 1, wherein the second housing is slidably attached to the first housing.

9. The electronic apparatus according to claim 1, wherein the first housing holds the plurality of oscillating elements and the sound wave sensor.

10. The electronic apparatus according to claim 1, wherein the plurality of oscillating elements and the sound wave sensor are located outside the second housing.

11. The electronic apparatus according to claim 1, wherein an entirety of the plurality of oscillating elements and the sound wave sensor are located outside the second housing.

12. A method of controlling an electronic apparatus that includes a first housing and a second housing that is movable in a direction in which the second housing covers one surface of the first housing, the method comprising:
providing in the electronic apparatus, a plurality of oscillating elements that oscillate sound waves outward from the one surface of the first housing, a control unit that controls the plurality of oscillating elements, and a sound wave sensor that detects sound waves having a specific wavelength;
holding the plurality of oscillating elements and the sound wave sensor by a same frame body; and
causing the control unit to oscillate the sensor sound waves having the specific wavelength outward from at least one of the oscillating elements, and when the sound wave sensor detects the sound waves having the specific wavelength, to determine that the electronic apparatus is closed and the second housing covers the one surface of the first housings,
wherein the first housing includes the plurality of oscillating elements and the sound wave sensor of the frame body.

13. The method according to claim 12, wherein the first housing includes the frame body.

14. The method according to claim 12, wherein the first housing holds the plurality of oscillating elements and the sound wave sensor.

15. The method according to claim 12, wherein the plurality of oscillating elements and the sound wave sensor are located outside the second housing.

16. The method according to claim 12, wherein an entirety of the plurality of oscillating elements and the sound wave sensor are located outside the second housing.

* * * * *